United States Patent [19]
Dixit et al.

[11] Patent Number: 6,106,995
[45] Date of Patent: Aug. 22, 2000

[54] ANTIREFLECTIVE COATING MATERIAL FOR PHOTORESISTS

[75] Inventors: Sunit S. Dixit; M. Dalil Rahman; Dinesh N. Khanna, all of Flemington; Joseph E. Oberlander, Phillipsburg; Dana L. Durham, Flemington, all of N.J.

[73] Assignee: Clariant Finance (BVI) Limited, Virgin Islands (Br.)

[21] Appl. No.: 09/373,319

[22] Filed: Aug. 12, 1999

[51] Int. Cl.$^7$ .................................................. G03C 1/492
[52] U.S. Cl. .................................... 430/270.1; 430/286.1; 430/311
[58] Field of Search .................. 430/270.1, 281.1, 430/286.1, 287.1, 283.1, 271.1, 311, 313, 315, 324

[56] References Cited

U.S. PATENT DOCUMENTS

| | | | |
|---|---|---|---|
| 4,956,230 | 9/1990 | Edwards et al. | 428/341 |
| 5,516,886 | 5/1996 | Rahman et al. | 528/482 |

FOREIGN PATENT DOCUMENTS

| | | |
|---|---|---|
| 11212264 | 8/1999 | Japan . |
| 11231545 | 8/1999 | Japan . |

OTHER PUBLICATIONS

Japan Patent No. 11212264A, Sanyo Chemical, "Photosensitive composition for producing black matrix and/or fluorescent plane of colour cathode–ray tube . . . ", Aug. 6, 1999 (abstract).

Japan Patent No. 11231545A, Miyazawa et al., "Reflection preventive film forming material for resist surface"; Aug. 27, 1999 (abstract).

*Primary Examiner*—Janet Baxter
*Assistant Examiner*—Yvette M. Clarke
*Attorney, Agent, or Firm*—Andrew F. Sayko, Jr.

[57] ABSTRACT

The present invention relates to an antireflective coating composition comprising an admixture of:
a) a polymer defined by the following structure:

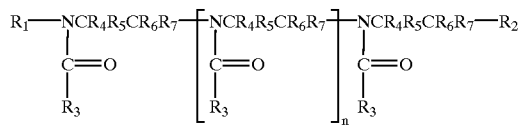

where, $R_1$ & $R_2$ are independently hydrogen, or $C_1$ to $C_5$ alkyl
$R_3$ is a methyl, ethyl, propyl or butyl group
$R_4$–$R_7$ are independently hydrogen, or $C_1$ to $C_5$ alkyl
n=10 to 50,000

(b) a fluorine-containing, sparingly water-soluble (0.1%–10% by weight in water) organic $C_3$–$C_{13}$ aliphatic carboxylic acid;
(c) a non-metallic hydroxide; and
(d) a solvent.

The invention also relates to a method for producing such an antireflective coating composition and to a method for producing a microelectronic device using such an antireflective coating composition in conjunction with a photoresist composition.

17 Claims, No Drawings

ANTIREFLECTIVE COATING MATERIAL FOR PHOTORESISTS

BACKGROUND OF THE INVENTION

The present invention relates to an antireflective coating composition, preferably a top antireflective coating composition, suitable for use with a photoresist; a process for producing such an antireflective coating composition; and a process for using such an antireflective coating composition in conjunction with a light-sensitive photoresist composition to produce semiconductors and other microelectronic devices. The present invention further relates to a process for coating substrates with such an antireflective coating composition, either before or after coating with a light-sensitive photoresist composition, as well as the process of coating, imaging and developing a light-sensitive photoresist composition in combination with such an antireflective coating composition on a substrate.

Thin film interference plays a central role in process control for optical microlithography utilized in producing microelectronic devices. Small variations in the thickness of a photoresist coating, or of thin films coated over or underneath the photoresist, can cause large exposure variations, which in turn usually cause two classes of undesirable line width variations.

1. As thin film thickness may vary from run to run, wafer to wafer, or across a wafer, line widths will vary from run to run, wafer to wafer or across a wafer.
2. As patterning takes place over the wafer topography, the photoresist coating thickness unavoidably changes at the topography edge, causing the line width to vary as it crosses the edge.

Avoiding such thin film interference effects is one of the key advantages of advanced processes such as x-ray lithography or multi-layer photoresist systems. However, Single Layer Resist (SLR) processes dominate manufacturing lines for producing semiconductors and other microelectronic devices, because of the their simplicity, better cost-effectiveness, and the relative cleanliness of wet developing processes when compared with dry processes.

Thin film interference results in periodic undulations in a plot of the exposure dose required to clear a positive photoresist (Dose To Clear) versus the photoresist coating thickness. Optically, on a photoresist-coated substrate, light is reflected from the bottom reflective surface ("mirror", which is caused by the effect of the substrate +thin films), which interferes with the refection of light from the top mirror (the photoresist/air interface). As optical lithography pushes towards shorter exposure wavelengths, thin film interference effects become increasingly more important. More severe swings in the intensity of such thin film interference are seen as the exposure wavelength decreases.

In the past, dyed photoresists have been utilized to attempt to solve these reflectivity problems. However, it is generally known that dyed photoresists only reduce reflectivity from the substrate, but do not substantially eliminate it. In addition, dyed photoresists frequently cause a reduction in the lithographic performance of the photoresist, together with possible sublimation of the dye and incompatibility of the dye with the other components in photoresist films. In cases where further reduction or substantial elimination of the swing ratio is required, an antireflective coating material is coated onto the substrate prior to or after coating with the photoresist, and prior to exposure. The photoresist is image-wise exposed to radiation and then developed. The antireflective coating in the exposed area is subsequently etched either before the photoresist (top antireflective coating) or after the photoresist (bottom antireflective coating), typically in an oxygen plasma, and the photoresist pattern is thereby transferred to the substrate. The etch rate of the antireflective coating should be relatively high in comparison to the photoresist, so that the antireflective coating is etched without excessive loss of the unexposed protective photoresist film during the etch process.

Antireflective coating compositions containing a dye for absorption of the light and an organic polymer to provide good coating properties are known in the prior art. However, the possibility of sublimation and/or diffusion of the dye into the environment and/or into the adjacent photoresist layer, during heating, make these types of antireflective coating compositions less desirable.

Polymeric organic antireflective coating compositions are known in the art, as described in EP 583,205, which is incorporated herein by reference. However, such antireflective coating compositions are cast from organic solvents, such as cyclohexanone and cyclopentanone. A concern with the potential hazards of working with antireflective coating materials containing such organic solvents was one reason that led to the development of the antireflective coating composition of the present invention.

Photoresist compositions are used in microlithography processes for making miniaturized electronic components such as in the fabrication of computer chips, memory devices and integrated circuits. Generally, in these processes, a thin film of a photoresist composition is first applied to a substrate, such as a silicon wafer used for making integrated circuits and other microelectronic devices. The coated substrate is then baked to substantially evaporate the photoresist solvent in the photoresist composition and to fix (improve adhesion) the coating of photoresist onto the substrate. The baked, coated surface of the substrate is next subjected to an image-wise exposure to radiation, normally actinic radiation.

In a positive-working photoresist composition, this exposure to radiation causes a chemical transformation in the exposed areas of the coated surface. Visible light, ultraviolet (UV) light, electron beam and X-ray radiant energy are radiation types commonly used today in such microlithographic processes. After this image-wise exposure, the coated substrate is treated with a developer solution to dissolve and remove either the radiation-exposed (positive-working photoresist) or the unexposed areas (negative-working photoresist) of the photoresist from the surface of the substrate. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist and all of the antireflective coating from the surface of the substrate.

When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

After development, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less then one-half micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to an antireflective coating composition. The invention further relates to a process for producing such an antireflective coating composition and for using such an antireflective coating composition in the production of microelectronic devices. The antireflective coating composition is applied on top of (after) or underneath (prior to) a photoresist composition, which may be either negative or positive-working, although positive-working photoresists are generally preferred.

The present invention also relates to a novel polymer, preferably water-soluble, suitable for use in an antireflective coating composition useful in photolithography processes for producing microelectronic devices. The polymer of the present invention is defined by the following structure:

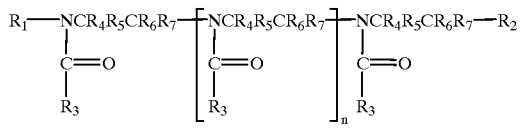

where, $R_1$ & $R_2$ are independently hydrogen, or $C_1$ to $C_5$ alkyl $R_3$ is a methyl, ethyl, propyl or butyl group $R_4$–$R_7$ are independently hydrogen, or $C_1$ to $C_5$ alkyl n=10 to 50,000

The polymer of the present invention is useful in an aqueous antireflective coating composition because it is soluble in water and other low toxicity solvents.

The present invention also relates to a process for producing an antireflective coating composition. The subject process comprises:

a) providing a polymer defined by the following structure:

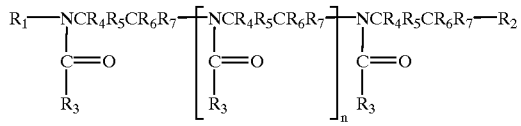

where, $R_1$ & $R_2$ are independently hydrogen, or $C_1$ to $C_5$ alkyl $R_3$ is a methyl, ethyl, propyl or butyl group $R_4$–$R_7$ are independently hydrogen, or $C_1$ to $C_5$ alkyl n=10 to 50,000

(b) formulating an antireflective coating composition by providing an admixture of:

(1) from about 1% to about 5%, preferably from about 1% to about 3%, of the polymer from step a), having a weight average molecular weight ("Mw") of from about 1000 to 500,000, preferably from about 2000 to 500,000, most preferably from about 5000 to 500,000;

(2) from about 2% to about 10%, preferably from about 2% to about 5%, of a fluorine-containing, sparingly water-soluble (0.1%–10% by weight in water, preferably 0.5%–5% by weight) organic $C_3$–$C_{13}$ aliphatic carboxylic acid;

(3) from about 0.5% to about 3%, preferably from about 0.5% to about 1.5%, of a non-metallic hydroxide, such as an ammonium hydroxide, preferably a tetramethyl ammonium hydroxide; and (4) at least 85%, preferably at least 90%, of a solvent, preferably deionized ("DI") water.

Suitable sparingly water-soluble fluorine containing organic $C_3$–$C_{18}$ aliphatic carboxylic acids include fluorinated carboxylic acids, such as pentadecafluorooctanoic acid or perfluorooctanoic acid. Suitable solvents for the antireflective coating compositions of the present invention may include water, diglyme, propylene glycol monomethyl ether acetate (PGMEA), propylene glycol monomethyl ether (PGME), mixtures of PGMEA and PGME, ethyl lactate (EL), ethyl-3-ethoxypropionate (EEP), mixtures of EL and EEP, xylene, n-butyl acetate, and ethylene glycol monoethyl ether acetate. The solvent may be present in the overall antireflective coating composition in an amount of from about 85% to about 98%, preferably from about 90% to about 98%, by weight of the solids in the composition. Solvents, of course, are substantially removed after coating of the top antireflective coating composition on a substrate.

The present invention also provides a process for producing microelectronic devices, such as semiconductors, using such an antireflective coating composition. The subject process comprises:

a) providing a polymer defined by the following structure:

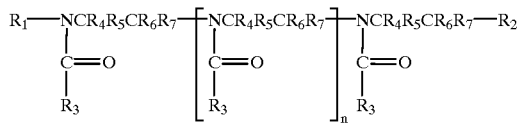

where, $R_1$ & $R_2$ are independently hydrogen, or $C_1$ to $C_5$ alkyl $R_3$ is a methyl, ethyl, propyl or butyl group $R_4$–$R_7$ are independently hydrogen, or $C_1$ to $C_5$ alkyl n=10 to 50,000

(b) formulating an antireflective coating composition by providing an admixture of:
  (1) from about 1% to about 5%, preferably from about 1% to about 3%, of the polymer from step a), having a weight average molecular weight ("$M_w$") of from about 1000 to 500,000, preferably from about 2000 to 500,000, most preferably from about 5000 to 500,000;
  (2) from about 2% to about 10%, preferably from about 2% to about 5%, of a fluorine-containing, sparingly water-soluble (0.1%–10% by weight in water, preferably 0.5%–5% by weight) organic ($C_3$–$C_{23}$) aliphatic carboxylic acid;
  (3) from about 0.5% to about 3%, preferably from about 0.5% to about 1.5%, of a non-metallic hydroxide, such as an ammonium hydroxide, preferably a tetramethyl ammonium hydroxide; and
  (4) at least 85%, preferably at least 90%, of a solvent, preferably DI water.
(c) either before or after coating a photoresist composition on a suitable substrate, coating the antireflective coating material from step b) on a suitable substrate by any conventional method used in the photoresist art, including dipping, spraying, whirling and spin coating;
(d) heating the coated substrate from step c) at a temperature from about 70° C. to about 110° C. for from about 30 seconds to about 180 seconds on a hot plate or at a temperature from about 70° C. to about 110° C. for from about 15 to about 90 minutes in an oven;
  (e) exposing the coated substrate from step d) to radiation, e.g., ultraviolet radiation, at a wavelength of from about 300 nm to about 450 nm, x-ray, electron beam, ion beam or laser radiation, in any desired pattern, such as those produced by the use of suitable masks, negatives, stencils, templates, etc.;
  (f) optionally subjecting the substrate from step e) to a post exposure second baking or heat treatment either before or after development;
  (g) developing the exposed photoresist-coated substrate from step e) either before or after the post exposure second baking of step f) to remove the image-wise exposed areas of a positive photoresist, or the unexposed areas of a negative photoresist.

DESCRIPTION OF THE PREFERRED EMBODIMENTS

When coating a photoresist composition onto a suitable substrate, the photoresist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. In the antireflective coating materials of the present invention, the solid components of the antireflective coating material are both soluble and spin castable from solvents having substantially low toxicity hazards. The preferred solvents that have such low toxicity include propylene glycol monomethyl ether acetate (PGMEA), propylene glycol monomethyl ether (PGME), and ethyl lactate (EL). An even more preferred and even less toxic solvent is water, which also has the advantages of ease of handling and transportation. The antireflective coating material of the present invention can be cast from such low toxicity solvents, preferably water, or mixtures of water and lower alkyl ($C_1$–$C_5$ alkyl) alcohols, lower alkyl ketones or lower alkyl acid esters, that are miscible with water. Antireflective coating materials are also disclosed in U.S. Pat. No. 5,525,457 and pending U.S. patent applications Ser. Nos. 08/698,742; 08/699,001 and 08/724,109, which are incorporated herein by reference. However, the dye functionality of the antireflective coating composition of the present invention, when attached to the specific types of monomer described, makes the antireflective coating compositions of the present invention significantly different from the prior art compositions. Another advantage of using the present antireflective coating compositions is that they are soluble in the preferred, lower toxicity solvents, and some of these same solvents can also be used to remove the edge bead of the antireflective coating. Therefore, no additional hazards or equipment expense may be incurred. In addition, many of these low toxicity solvents are also used for photoresists and photoresist processing.

The antireflective coating compositions of the present invention also have good solution stability. Additionally, substantially no intermixing occurs between the antireflective coating and the adjacent photoresist film. The antireflective coating also has good dry etching properties, which enable a good image transfer from the photoresist to the substrate and good absorption characteristics, to substantially prevent reflective notching and line width variations.

An important strategy for reducing thin film interference in the production of microelectronic devices is to reduce the substrate reflectivity through the use of an absorptive antireflective coating composition. One way of doing this is to apply such an antireflective coating material on top of the photoresist, prior to exposure. Interfacial reflection in thin films of photoresist produces interference phenomena and reflective notching, i.e. undercutting, of the resist pattern at the resist/substrate interface. A simple analytical expression of the reflectivity swing ratio ($R_{max}/R_{min}$) due to thin film interference is:

$$S = 4 \cdot R_1 R_2 \exp(-\alpha D) \qquad (1)$$

Where $R_1$ is the reflectivity at the photoresist/air or photoresist/antireflective coating interface, $R_2$ is the reflectivity from the photoresist/substrate interface, $\alpha$ is the photoresist absorption coefficient, and D is the average thickness of the photoresist over which the swing curve occurs. The swing ratio must be minimized for better line width control, but when the wavelength of light used to expose the resist substantially decreases (for example from g-line to i-line and then further to Deep UV) the swing ratio dramatically increases. As the wavelength of light is further decreased to enable the printing of smaller and smaller geometries (e.g. 193 nanometers), control of the swing ratio becomes even more important.

The use of an antireflective coating can significantly reduce the swing ratio by reducing $R_1$ in equation (1). Assuming a non-absorbing film and normally incident radiation, $R_1$ is reduced to zero when $n_{topcoat} = (n_{resist})^{1/2}$ and the film optical thickness is a quarter wavelength ($\lambda/4n_{topcoat}$). These two antireflecting conditions are familiar from the theory of thin film optics. A bottom antireflective coating, but not a top antireflective coating, will reduce reflective notching by significantly reducing $R_2$ in equation 1.

The antireflective coating compositions produced by the described process are particularly suitable for application onto a thermally grown silicon/silicon dioxide-coated wafer, such as are utilized in the production of microprocessors and other microelectronic devices. An aluminum/aluminum oxide wafer can also be used. The substrate may also comprise various polymeric resins, especially transparent polymers such as polyesters. The substrate may also have an adhesion promoted layer of a suitable composition, such as one containing a hexa-alkyl disilazane, such as hexamethyl disilazane ("HMDS").

The antireflective coating composition is coated onto the substrate either over or beneath the photoresist composition, and the coated substrate is then treated at a temperature from about 70° C. to about 101° C. for from about 30 seconds to about 180 seconds on a hot plate or for from about 15 to about 90 minutes in an oven. This temperature treatment is selected in order to substantially reduce the concentration of residual solvents in the photoresist film and antireflective coating, while not causing substantial thermal degradation of the photosensitizer in the photoresist composition. In general, one desires to minimize the concentration of solvents and this first temperature treatment is conducted until substantially all of the solvents have evaporated and a thin coating of photoresist composition, on the order of one micron in thickness, remains on the substrate.

In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The substrate is then optionally subjected to a post exposure baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist/antireflective coating composition-coated substrate is then developed to remove the image-wise exposed areas (for a positive photoresist) or the unexposed areas (for a negative photoresist), such as by immersion in an alkaline developing solution or using a spray development process. The developing solution is preferably agitated, for example, by nitrogen burst agitation. The substrates are allowed to remain in the developer until all, or substantially all, of the photoresist coating has dissolved from the exposed areas (for a positive photoresist) or the unexposed areas (for a negative photoresist). Developers that may be used include aqueous solutions of ammonium hydroxides. One preferred hydroxide is tetramethyl ammonium hydroxide. After removal of the coated wafers from the developing process, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may then be etched, such as with a buffered, hydrofluoric acid base etching solution.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

| An antireflective coating composition composed of: | |
|---|---|
| Aquazol ®-50(polyoxazoline: $M_w$ 50,000) | 3.30 g |
| FC-26 ® (perfluorooctanoic acid) | 6.90 g |
| TMAH (2.38% by weight solution in water) | 2.0 g |
| DI water | 188 g | was prepared by dissolving the first three ingredients in DI water and then filtering the solution through a 1.0 μm (micrometer) Filter.

The antireflective coating composition formed a 772.7 A° (Angstrom) film when spin coated at 4000 RPM, with a refractive index of 1.40 for the coated film.

EXAMPLE 2

| An antireflective coating composition composed of: | |
|---|---|
| Aquazol ®-500 ($M_w$ 50,000) | 3.30 g |
| FC-26 ® | 7.60 g |
| 2.38% TMAH | 2.05 g |
| DI water | 188 g | was prepared by dissolving the first three ingredients in DI water and filtering the solution through a 1.0 μm (micrometer) filter. The coating formed an 800 A° film when spin coated at 6500 RPM, with a refractive index of 1.39 for the coated film.

EXAMPLE 3

AZ® 7908 photoresist (available from the Business Unit Electronic Materials of Clariant Corporation) was coated onto each of two hexamethyldisilazane (HMDS) primed silicon wafers to a 1.083 μm (micrometer) film thickness and then soft baked at 90° C. for 60 seconds on an SVG® 8100 I-line hot plate. One coated wafer was exposed using a 0.54 NA NIKON® i-line stepper and a NIKON® resolution reticle. The second coated wafer was exposed using an 11×11 Quality Control ("QC") program with a mask on a 0.54 NA NIKON® i-line stepper. Both exposed wafers were PEB (post exposure baked) at 110° C. for 70 seconds on a in-line hot plate and then developed using AZ® 300 MIF TMAH (tetramethyl ammonium hydroxide—2.38%, by weight) developer. The developed wafers were then examined using a HITACHI® S-4000 SEM (scanning electron microscope). A nominal dose (Dose to Print, DTP) was measured at the best focus, the dose required to precisely replicate a given feature. Resolution and depth of focus (DOF) were measured and are shown in Table 1 below. The energy of the first clear die was recorded (Dose to Clear, DTC) from the second wafer and the results are also shown in Table 1 below.

EXAMPLE 4

A sample of AZ® 7908 photoresist was coated on an HMDS primed silicon wafer to a 1.083 μm (micrometer) film thickness and then soft baked at 90° C. for 60 seconds on an SVG(D 8100 inline hot plate. The antireflective coating composition from Example 1 was then coated on top of this photoresist to a 0.077 μm (micrometer) film thickness. The wafer was first exposed using an 11×11 "QC" program with a mask on a 0.54 NA NIKONO i-line stepper and then the exposure matrix was printed on the coated wafers using a 0.54 NA NIKON(®) i-line stepper and a NIKON® resolution reticle. The exposed wafer was post exposure baked at 110° C. for 70 seconds on an in-line hot plate. The wafer was then developed using AZ®g 300 MIF TMAH developer. The developed wafer was examined using a HITACHI® S-4000 SEM. Dose to Clear and Dose to Print were measured at the best focus. Resolution and depth of focus (DOF) were also measured. The results are shown in Table 1 below.

EXAMPLE 5

AZ® 7908 photoresist was coated on an HMDS primed silicon wafer to a 1.083 μm (micrometer) film thickness and then soft baked at 90° C. for 60 seconds on an SVG® 8100 inline hot plate. The antireflective coating composition from Example 2 was then coated on top of this photoresist to a 0.077μm (micrometer) film thickness. The wafer was first exposed using an 11×11 "QC" program with a mask on a 0.54 NA NIKON® i-line stepper and then the exposure matrix was printed on the coated wafer using a 0.54 NA NIKON® i-line stepper and a NIKON® resolution reticle. The exposed wafer was then post exposure baked at 110° C. for 70 seconds on an in-line hot plate. The wafer was then developed using AZ® 300 MIF TMAH developer. The developed wafer was examined using a HITACHI® S-4000 SEM. Dose to clear and Dose to Print were measured at the best focus. Resolution and depth of focus (DOF) were also measured. The results are shown in Table 1 below.

TABLE 1

| Samples | DTC mj/cm$^2$ | DTP mj/cm$^2$ | Resolution μm | DOF μm |
|---|---|---|---|---|
| Example 3 | 78 | 196 | 0.30 | ND |
| Example 4 | 66 | 160 | 0.28 | ND |
| Example 5 | 72 | 168 | 0.28 | ND |
| Example 7 | 77 | 180 | 0.32 | 1.0 |
| Example 8 | 62 | 140 | 0.30 | 1.2 |
| Example 9 | 54 | 120 | 0.36 | 1.2 |
| Example 10 | 45 | 100 | 0.32 | 1.8 |

EXAMPLE 6

Four lots (A, B, C and D) of an antireflective coating composition of the present invention were each prepared by dissolving 0.83% of tetramethyl ammonium hydroxide, 1.36% Aquazol®50, and 2.83% FC-26®) in DI water and then filtering the solution through a 1.0-micron (micrometer) filter. The coating uniformity (TD. DEV.), film thickness when spin coated at 4000 RPM [FT(A°)], refractive index (RI) and standard deviation (STD. DEV.) for each lot are shown in Table 2 below:

TABLE 2

| LOT# | FT(A°) | TD.DEV. | RI | STD.DEV. |
|---|---|---|---|---|
| A | 568 | 28 | 1.3803 | 0.0062 |
| B | 571 | 17 | 1.3833 | 0.0066 |
| C | 580 | 36 | 1.3720 | 0.0054 |
| D | 571 | 10 | 1.3850 | 0.0091 |

EXAMPLE 7

AZ® 7900 photoresist (available from Business Unit Electronic Materials of Clariant Corporation) was coated on each of two HMDS primed silicon wafers to a 1.0831m (micrometer) film thickness and then both soft baked at 90° C. for 60 seconds on an SVG® 8100 inline hot plate. The exposure matrix was printed on both coated wafers using a 0.54 NA NIKON® i-line stepper and a NIKON® resolution reticle. Both wafers were then exposed using an 11×11 "QC" program with a mask on a 0.54 NA NIKON® i-line stepper. Both exposed wafers were post exposure baked at 110° C. for 70 seconds on an in-line hot plate and then developed using AZ® 300 MIF TMAH developer. Both developed wafer were examined using a HITACHIg S-4000 SEM. Dose to Print at the best focus, resolution and depth of focus were measured on one wafer. Dose to Clear was measured on the other wafer The results are shown in Table 1 above.

EXAMPLE 8

A photoresist identical to that used in Example 7 was coated on an HMDS primed silicon wafer to a 1.083 μm (micrometer) film thickness and then soft baked at 90° C. for 60 seconds on an SVG® 8100 inline hot plate. Lot A of the antireflective coating composition from Example 6 was coated on top of this photoresist to a 0.077μm (micrometer) film thickness. The wafer was first exposed using an 11×11 "QC" program with a mask on a 0.54 NA NIKON® i-line stepper and then the exposure matrix was printed on the coated wafer using a 0.54 NA NIKON® i-line stepper and a NIKON® resolution reticle. The exposed wafer was post exposure baked at 110° C. for 70 seconds on an in-line hot plate. The wafer was then developed using AZ® 300 MIF TMAH developer. The developed wafer was then examined using a HITACHI® S-4000 SEM. Dose to Clear and Dose to Print were measured at the best focus. Resolution and depth of focus were also measured. The results are shown in Table 1 above.

EXAMPLE 9

A photoresist identical to that used in Example 7 was coated on each of two HMDS primed silicon wafers to a 1.083 μm (micrometer) film thickness and then soft baked at 90° C. for 60 seconds on an SVG® 8100 inline hot plate. The exposure matrix was printed on one coated wafer using a 0.54 NA NIKON® i-line stepper and a NIKON® resolution reticle. The second coated wafer was exposed using an 11×11 "QC" program with a mask on a 0.54 NA NIKON® i-line stepper. Both exposed wafers were post exposure baked at 110° C. for 70 seconds on an in-line hot plate and then developed using AZ(® 300 MIF TMAH developer. The first developed wafer was examined using a HITACHI® S-4000 SEM. Dose to Print at the best focus, resolution and depth of focus were measured on one wafer. Dose to Clear was measured on the other wafer The results are shown in Table 1 above.

EXAMPLE 10

A photoresist identical to that used in Example 7 was coated on an HMDS primed silicon wafer to a 1.083μm (micrometer) film thickness and then soft baked at 90° C. for 60 seconds on an SVG® 8100 inline hot plate. Lot A of the antireflective coating composition from Example 6 was coated on top of this photoresist to a 0.077μm (micrometer) film thickness. The wafer was first exposed using an 11×11 "QC" program with a mask on a 0.54 NA NIKON® i-line stepper and then the exposure matrix was printed on the coated wafer using a 0.54 NA NIKON® i-line stepper and a NIKON® resolution reticle. The exposed wafer was post exposure baked at 110° C. for 70 seconds on an in-line hot plate. The wafer was then developed using AZ® 300 MIF TMAH developer. The developed wafer was examined using a HITACHI® S-4000 SEM. Dose to clear and Dose to Print, were measured at the best focus. Resolution and depth of focus (DOF) were also measured. The results are shown in Table 1 above.

EXAMPLE 11

Four additional lots (Lots E, F, G and H) of an antireflective coating composition of the present invention were each prepared by dissolving 0.71% of tetramethyl ammonium hydroxide, 1.17% Aquazol®-500 and 2.71% FC-26® in DI water and filtering the solution through a 1.0 micron (micrometer) filter. The coating uniformity, film thickness, standard deviation and refractive index for each lot, each spin coated at 4000 RPM are shown below in Table 3.

TABLE 3

| LOT# | FT(A°) | TD.DEV. | RI | STD.DEV. |
|---|---|---|---|---|
| E | 627 | 101 | 1.3277 | 0.0470 |
| F | 676 | 74 | 1.3507 | 0.0343 |
| G | 621 | 86 | 1.3109 | 0.0487 |
| H | 648 | 74 | 1.3490 | 0.0514 |

EXAMPLE 12

Four additional lots (I, J, K and L) of an antireflective coating composition of the present invention were each prepared by dissolving 1.02% of tetramethyl ammonium hydroxide, 1.64% Aquazol®-5 ($M_w$ 5,000), and 3.43% FC-26® in DI water. The solution was filtered through a 1.0 micron (micrometer) filter. The coating uniformity, film thickness, standard deviation and refractive index for each lot, each spin coated on one of four wafers at 4000 RPM, are shown below in Table 4.

TABLE 4

| LOT# | FT(A°) | TD.DEV. | RI | STD.DEV. |
|---|---|---|---|---|
| I | 671 | 50 | 1.3080 | 0.0823 |
| J | 684 | 60 | 1.3301 | 0.0258 |
| K | 649 | 52 | 1.3370 | 0.0140 |
| L | 667 | 26 | 1.3315 | 0.0183 |

Example 13

Four additional lots (M, N, O and P) of an antireflective coating composition of the present invention were each prepared by dissolving 1.02% of tetramethyl ammonium hydroxide, 1.64% Aquazol®-200, ($M_w$ 200,000), and 3.43% FC-260 in DI water. The solution was then filtered through a 1.0 micron (micrometer) filter. The coating uniformity, film thickness, standard deviation and refractive index for each lot, each spin coated on one of four wafers at 4000 RPM are shown below in Table 5.

TABLE 5

| LOT# | FT(A°) | TD.DEV. | RI | STD.DEV. |
|---|---|---|---|---|
| M | 971 | 61 | 1.3134 | 0.0639 |
| N | 995 | 57 | 1.3446 | 0.0408 |
| O | 908 | 62 | 1.2823 | 0.0990 |
| P | 1073 | 29 | 1.3469 | 0.0129 |

Example 14

Three additional lots (R, S, and T) of an antireflective coating composition of the present invention were each prepared by dissolving 1.02% of tetramethyl ammonium hydroxide, 1.48% Aquazol®-50, and 3.30% of the TMAH salt of FC-26® in DI water. The solution was then filtered through a 1.0 micron (micrometer) filter. The coating uniformity, film thickness, standard deviation and refractive index for each lot, each spin coated on one of three wafers at 4000 RPM are shown below in Table 6.

TABLE 6

| LOT# | FT(A°) | TD.DEV. | RI | STD.DEV. |
|---|---|---|---|---|
| R | 757 | 20 | 1.4156 | 0.00027 |
| S | 541 | 12 | 1.4200 | 0.0043 |
| T | 568 | 10 | 1.4117 | 0.0054 |

Unless otherwise specified all parts and percents are by weight, all molecular weights are weight average molecular weight ($M_w$) determined by GPC, and all temperatures are in degrees Centigrade.

Having disclosed our invention, what we desire to claim is:

What is claimed is:

1. A process for producing an antireflective coating composition comprising:

a) providing a polymer defined by the following structure:

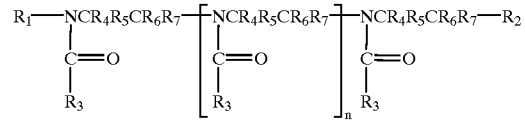

where,
$R_1$ & $R_2$ are independently hydrogen, or $C_1$ to $C_5$ alkyl
$R_3$ is a methyl, ethyl, propyl or butyl group
$R_4$–$R_7$ are independently hydrogen, or $C_1$ to $C_5$ alkyl
n=10 to 50,000

(b) formulating a top antireflective coating composition by providing an admixture of:
(1) the polymer from step a), having a weight average molecular weight of from about 1000 to 500,000;
(2) a fluorine-containing, sparingly water-soluble (0.1%–10% by weight in water) organic $C_3$–$C_{13}$ aliphatic carboxylic acid;
(3) a non-metallic hydroxide; and
(4) a solvent.

2. The process of claim 1 wherein the non-metallic hydroxide in step (b) is an ammonium hydroxide.

3. The process of claim 2 wherein the non-metallic hydroxide is an ammonium hydroxide selected from the group consisting of tetramethyl ammonium hydroxide, tetraethyl ammonium hydroxide, pyridinium hydroxide, and methyl pyridinium hydroxide.

4. The process of claim 1 wherein the polymer has a molecular weight of from about 2,000 to about 500,000.

5. The process of claim 1 wherein the polymer has a molecular weight of from about 5,000 to about 500,000.

6. An antireflective coating composition comprising an admixture of:

a) a polymer defined by the following structure:

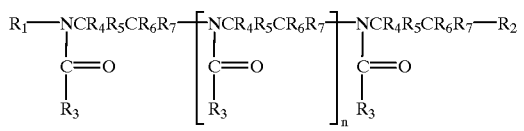

where,
$R_1$ & $R_2$ are independently hydrogen, or $C_1$ to $C_5$ alkyl
$R_3$ is a methyl, ethyl, propyl or butyl group
$R_4$–$R_7$ are independently hydrogen, or $C_1$ to $C_5$ alkyl
n=10 to 50,000

(b) a fluorine-containing, sparingly water-soluble (0.1%–10% by weight in water) organic $C_3$–$C_{13}$ aliphatic carboxylic acid;

(c) a non-metallic hydroxide; and (d) a solvent.

7. The antireflective coating composition of claim 6 wherein the non-metallic hydroxide is an ammonium hydroxide.

8. The antireflective coating composition of claim 7 wherein the non-metallic hydroxide is an ammonium hydroxide selected from the group consisting of tetramethyl ammonium hydroxide, tetraethyl ammonium hydroxide, pyridinium hydroxide, and methyl pyridinium hydroxide.

9. The antireflective coating composition of claim 6 wherein the polymer has a molecular weight of from about 2,000 to about 500,000.

10. The antireflective coating composition of claim 6 wherein the polymer has a molecular weight of from about 5,000 to about 500,000.

11. A process for producing a microelectronic device using an antireflective coating composition, said process comprising:

a) providing a polymer defined by the following structure:

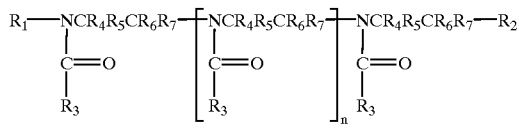

where,
$R_1$ & $R_2$ are independently hydrogen, or $C_1$ to $C_5$ alkyl
$R_3$ is a methyl, ethyl, propyl or butyl group
$R_4$–$R_7$ are independently hydrogen, or $C_1$ to $C_5$ alkyl
n=10 to 50,000

(b) formulating an antireflective coating composition by providing an admixture of:
(1) the water-soluble polymer from step a), having a weight average molecular weight ("$M_w$") of from about 1000 to 500,000;
(2) a fluorine-containing, sparingly water-soluble (0.1%–10% by weight in water) organic $C_3$–$C_{13}$ aliphatic carboxylic acid;
(3) a non-metallic hydroxide; and
(4) a solvent;

(c) either before or after coating a photoresist composition onto a suitable substrate, coating the antireflective coating from step (b) onto said suitable substrate;

(d) heating the coated substrate from step (c) at a temperature from about 70° C. to about 110° C. for from about 30 seconds to about 180 seconds on a hot plate or at a temperature from about 70° C. to about 110° C. for from about 15 to about 90 minutes in an oven;

(e) exposing the coated substrate from step (d) to radiation in a desired pattern;

(f) developing the exposed coated substrate from step (e).

12. The process of claim 11 wherein the non-metallic hydroxide in step (b) is an ammonium hydroxide.

13. The process of claim 12 wherein the non-metallic hydroxide is an ammonium hydroxide selected from the group consisting of tetramethyl ammonium hydroxide, tetraethyl ammonium hydroxide, pyridinium hydroxide, and methyl pyridinium hydroxide.

14. The process of claim 11 wherein the polymer has a molecular weight of from about 2,000 to about 500,000.

15. The process of claim 11 wherein the polymer has a molecular weight of from about 5,000 to about 100,000.

16. The process of claim 11 wherein the photoresist is applied to the substrate prior to the antireflective coating composition.

17. The process of claim 11 wherein the photoresist is applied to the substrate after the antireflective coating composition.

* * * * *